(12) United States Patent
Yang et al.

(10) Patent No.: US 11,746,406 B2
(45) Date of Patent: Sep. 5, 2023

(54) MASK, PREPARATION METHOD AND OPERATION METHOD THEREOF

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Chengfa Yang, Beijing (CN); Zhiming Lin, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 1225 days.

(21) Appl. No.: 16/072,359

(22) PCT Filed: Dec. 18, 2017

(86) PCT No.: PCT/CN2017/116953
§ 371 (c)(1),
(2) Date: Jul. 24, 2018

(87) PCT Pub. No.: WO2018/218935
PCT Pub. Date: Dec. 6, 2018

(65) Prior Publication Data
US 2021/0172047 A1 Jun. 10, 2021

(30) Foreign Application Priority Data

Jun. 2, 2017 (CN) .......................... 201710407553.2

(51) Int. Cl.
*C23C 14/04* (2006.01)
*G03F 1/38* (2012.01)
(Continued)

(52) U.S. Cl.
CPC ............ *C23C 14/042* (2013.01); *B05C 17/06* (2013.01); *B05C 21/005* (2013.01); *G03F 1/38* (2013.01); *C23C 14/24* (2013.01)

(58) Field of Classification Search
None
See application file for complete search history.

(56) References Cited

U.S. PATENT DOCUMENTS

| | | |
|---|---|---|
| 2003/0049519 A1 | 3/2003 | Ishida et al. |
| 2015/0299840 A1* | 10/2015 | Osaki .................... C23C 14/042 118/505 |
| 2018/0291494 A1 | 10/2018 | Cao |

FOREIGN PATENT DOCUMENTS

| | | | |
|---|---|---|---|
| CN | 1358055 A | 7/2002 | |
| CN | 104372292 A * | 2/2015 | ........... C23C 14/042 |

(Continued)

OTHER PUBLICATIONS

The Extended European Search Report dated Dec. 21, 2020; Appln. No. 17892059.1.

(Continued)

*Primary Examiner* — Jethro M. Pence

(57) ABSTRACT

A mask, and a preparation method and an operation method thereof are disclosed. The mask includes: a support and a mask strip mounted on the support, the mask strip including at least two connecting portions connected with the support, and a pattern portion located between the connecting portions, the pattern portion including a first outer surface, and the connecting portion including a second outer surface; wherein the second outer surface and the first outer surface are non-coplanar with each other.

7 Claims, 6 Drawing Sheets

(51) Int. Cl.
    *B05C 17/06*    (2006.01)
    *B05C 21/00*    (2006.01)
    *C23C 14/24*    (2006.01)

(56) References Cited

FOREIGN PATENT DOCUMENTS

| | | | |
|---|---|---|---|
| CN | 204509446 U | * | 7/2015 |
| CN | 204509446 U | | 7/2015 |
| CN | 105200370 A | | 12/2015 |
| CN | 205803576 U | | 12/2016 |
| DE | 102007032228 A1 | | 1/2009 |
| JP | 2000192229 A | | 7/2000 |
| JP | 2004006257 A | | 1/2004 |
| JP | 2005339858 A | | 12/2005 |
| JP | 2005339861 A | | 12/2005 |
| JP | 2006037203 A | | 2/2006 |
| JP | 4953424 B2 | | 6/2012 |
| JP | 4953525 B2 | | 6/2012 |
| WO | 2007/073072 A1 | | 6/2007 |
| WO | 2009007075 A2 | | 1/2009 |
| WO | 2018/148992 A1 | | 8/2018 |

OTHER PUBLICATIONS

The First Chinese Office Action dated Nov. 29, 2019; Appln. No. 201710407553.2
India Office Action dated May 20, 2020; Application No. 201847027554.
The First Japanese Office Action dated Nov. 1, 2021; Appln. No. 2018-538726.
International Search Report and Written Opinion dated Mar. 15, 2018; PCT/CN2017/116953.

* cited by examiner

US 11,746,406 B2

MASK, PREPARATION METHOD AND OPERATION METHOD THEREOF

The present application claims priority of Chinese Patent Application No. 201710407553.2 filed on Jun. 2, 2017, the disclosure of which is incorporated herein by reference in its entirety as part of the present application.

TECHNICAL FIELD

At least one embodiment of the present disclosure relates to a mask, and a preparation method and an operation method thereof.

BACKGROUND

In a production procedure of various electronic products such as a transistor, a liquid crystal panel, and an Organic Light-Emitting Diode (OLED) panel, a mask is required to prepare a desired pattern. However, during an operation procedure, the mask will damage a the substrate to be coated, and affect the defect-free ratio of evaporation of the substrate.

SUMMARY

At least one embodiment of the present disclosure provides a mask, which comprises a support and a mask strip mounted on the support, the mask strip comprising at least two connecting portions each connected with the support, and a pattern portion located between the at least two connecting portions, the pattern portion comprising a first outer surface, and the connecting portion comprising a second outer surface; wherein the first outer surface and the second outer surface are non-coplanar with each other.

At least one embodiment of the present disclosure provides a method of preparation a mask, which comprises: providing a support and mounting a mask strip on the support; wherein the mask strip comprises at least two connecting portions each connected with the support, and a pattern portion located between the at least two connecting portions, the pattern portion comprises a first outer surface, and each connecting portion comprises a second outer surface; and the second outer surface and the first outer surface are non-coplanar with each other.

At least one embodiment of the present disclosure provides an operation method of the afore-mentioned mask, which comprises: placing a substrate on the mask, wherein a surface of the substrate to be coated is in contact with the first outer surface of the mask, and the surface of the substrate to be coated is in non-contact with the second outer surface of the mask.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

FIG. 1b is a partial top view of the mask shown in FIG. 1a;
FIG. 1c is a side view of the mask shown in FIG. 1a.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "comprises," "comprising," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may comprise an electrical connection, directly or indirectly. "On," "under," "right," "left" and the like are only used to indicate relative position relationship, and when the position of the object which is described is changed, the relative position relationship may be changed accordingly.

Figure 4:
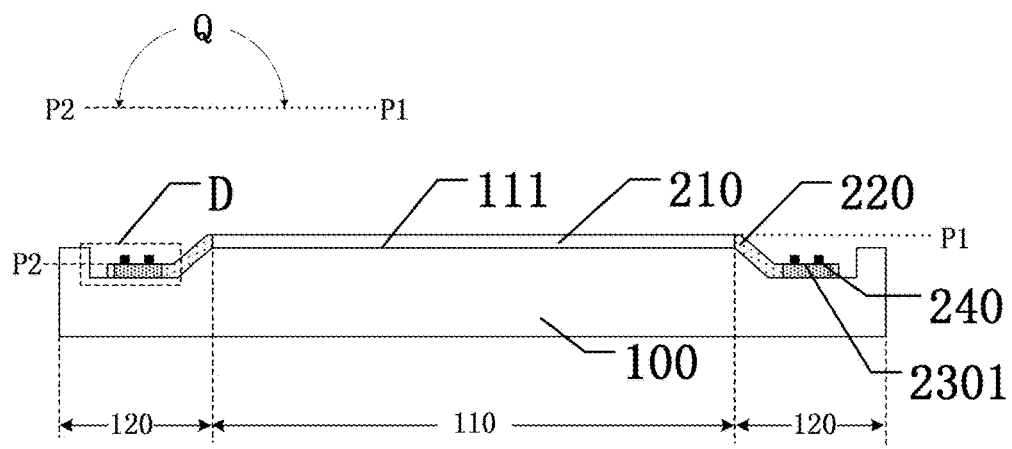
FIG. 4 is a structural schematic diagram of a yet another mask provided by an embodiment of the present disclosure.
Figure 5:
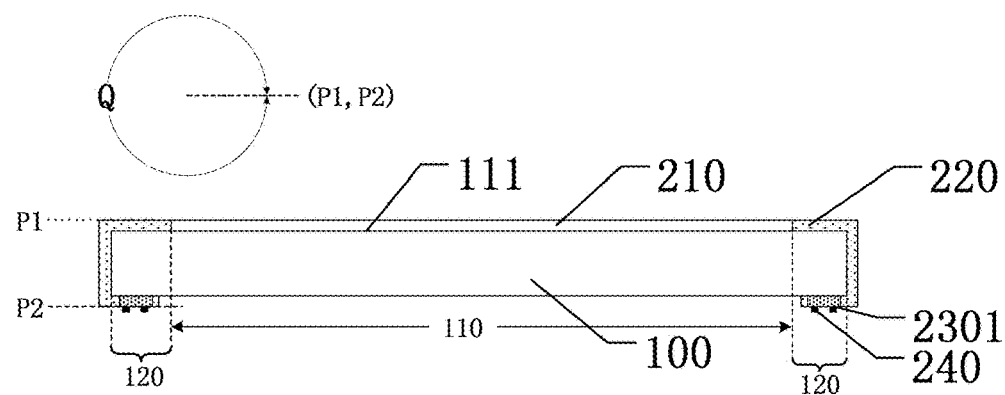
FIG. 5 is a structural schematic diagram of a still another mask provided by an embodiment of the present disclosure.

In the embodiments of the present disclosure, the term "pattern portion of a mask" refers to a portion of the mask that comprises a patterned structure of a shielding region and/or a non-shielding region; the term "connecting portion of the mask" refers to a portion connected with or fixed onto a support; and the term "mounting region of the connecting portion" refers to a region where the connecting portion is provided thereon with a connector such as a screw, a pin, a welding spot and a pad. The term "second outer surface" refers to a surface on which the connector is located, and the term "first outer surface" refers to a surface facing the substrate to be coated. In the embodiments of the present disclosure, the terms "second outer surface" and "first outer surface" should be understood to have directionality. For example, in condition that the second outer surface and the first outer surface are two planes parallel to each other and facing a same direction, an included angle between the two planes should be regarded as 180 degrees (for example, as illustrated in FIG. 4); in condition that the second outer surface and the first outer surface are two planes parallel to each other and facing opposite directions, the included angle between the two planes should be regarded as 360 degrees (for example, as illustrated in FIG. 5).

Figure 1A:
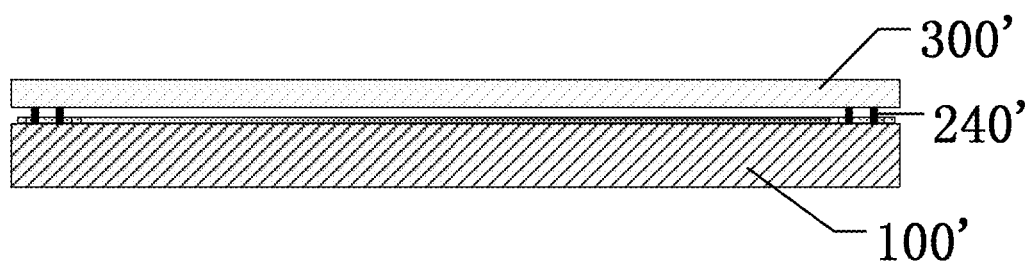
FIG. 1a is a front view of a mask.
Figure 1B:
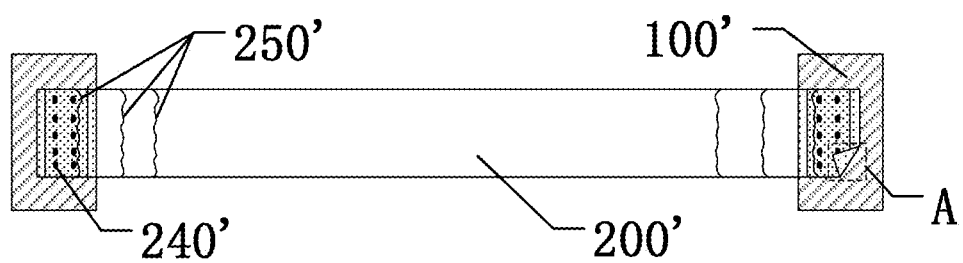

FIG. 1a is a front view of a mask, and FIG. 1b is a partial top view of the mask shown in FIG. 1a. As shown in FIG. 1a and FIG. 1b, the mask comprises a support 100' and at least one mask strip 200', and each mask strip 200' is fixed onto the support 100' by at least one welding spot 240'. During the evaporation process, the mask 100' is disposed on a substrate 300' to be coated, because a height of the welding spot 240' is usually higher than a surface of the mask strip 200', the welding spot 240' will be in direct contact with the substrate 300' and a gap will be formed between the substrate 300' and the mask strip 200', which not only affects fitting closeness between the mask strip 200' and the substrate 300', but also causes evaporation materials to easily accumulate within the gap and hard to remove. In addition, because the welding spot 240' is in direct contact with the substrate 300', in a position corresponding to the welding spot 240' (a connector), the substrate 300' is subjected to a large partial pressure, and is apt to crack, thereby causing cracks occurred in the substrate 300'.

As shown in FIG. 1b, when the mask strip 200' is subjected to, for example, an external force, and the like, a corner (such as region A in FIG. 1b) of the mask strip 200' is easily warped, and the warped portion of the mask strip 200' is apt to cause the substrate 300' to be scratched or the damaged substrate 300' in turn causes the mask strip 200' to be scratched, and the warped portion (e.g., the corner) of the mask strip 200' will also increase a distance between the mask strip 200' and the substrate 300'. In addition, the mask strip 200' is fixed by the welding spot 240' in a point fixation manner, which is apt to generate a wrinkle 250' in the mask strip 200', and affect the defect-free ratio of evaporation of the substrate 300'.

Figure 1C:
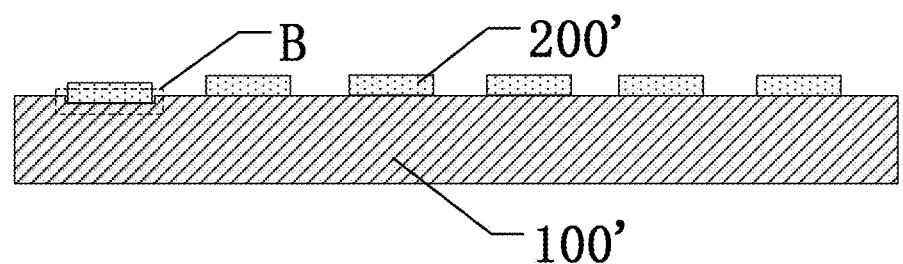

FIG. 1a is a side view of the mask shown in FIG. 1a. As shown in FIG. 1c, the mask needs to be repaired after the mask strip 200' is replaced, but a portion of the original mask strip 200' fixed by the welding spot 240' needs to be polished, and polishing will cause the support of a corresponding region to be worn. For example, as shown in FIG. 1c, a portion of the support 100' located in a region B is worn to a higher degree, resulting in that the mask strip 200' of the region B is not coplanar with other mask strips 200'. If the repairing operation is performed for a plurality of times, flatness of the region of the support 100' for fixing the mask strip 200' will be affected, which further affects evaporation accuracy of the mask.

At least one embodiment of the present disclosure provides a mask, and a preparation method and an operation method thereof. The mask comprises a support and a mask strip mounted on the support, the mask strip comprising at least two connecting portions connected with the support, and a pattern portion located between the at least two connecting portions, the pattern portion comprising a first outer surface, the connecting portion comprising a second outer surface, the first outer surface and the second outer surface being non-coplanar with each other. While the mask is disposed on a substrate in evaporation process, the substrate to be coated may be provided on the first outer surface; because the second outer surface of the mask strip is not coplanar with the first outer surface, the second outer surface may be distal to the substrate, and both a warped corner of the mask strip and the connector on the second outer surface will not be in contact with the substrate; in this way, the first outer surface of the mask strip may be closely fitted on the substrate, and the defect-free ratio of evaporation of the substrate may be increased.

Hereinafter, the mask, and the preparation method and the operation method thereof according to at least one embodiment of the present disclosure will be described in detail in conjunction with the accompanying drawings.

Figure 2A:
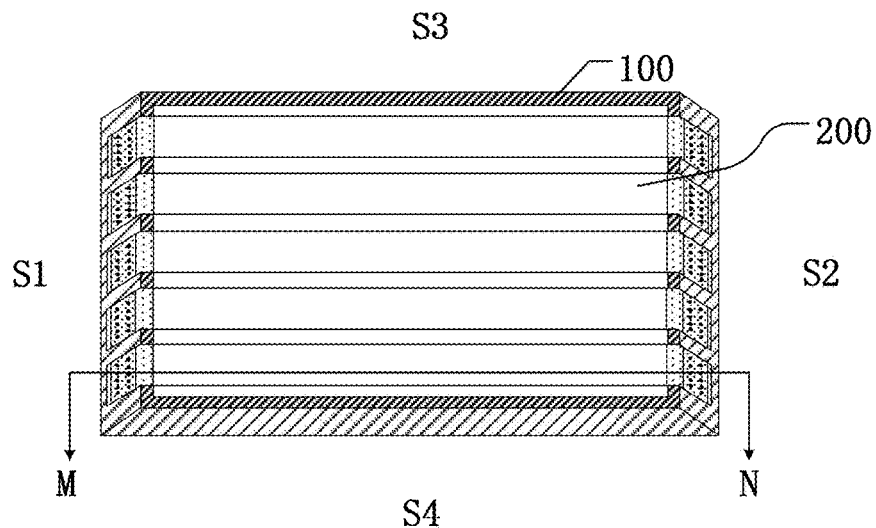
FIG. 2a is a structural schematic diagram of a mask provided by an embodiment of the present disclosure.
Figure 2B:
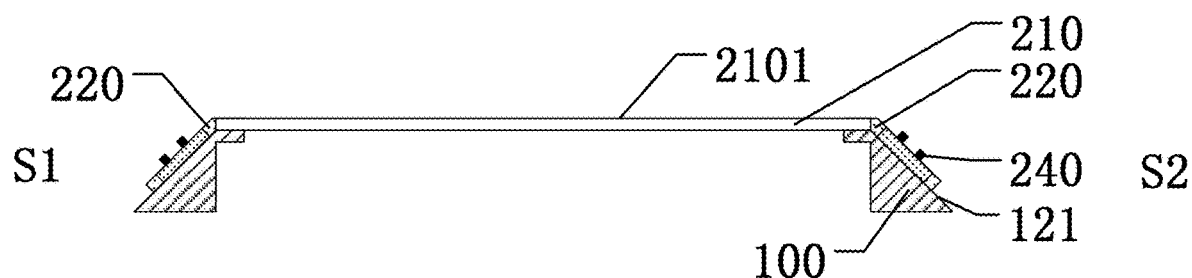
FIG. 2b is a cross-sectional view of the mask shown in FIG. 2a along M-N.
Figure 2C:
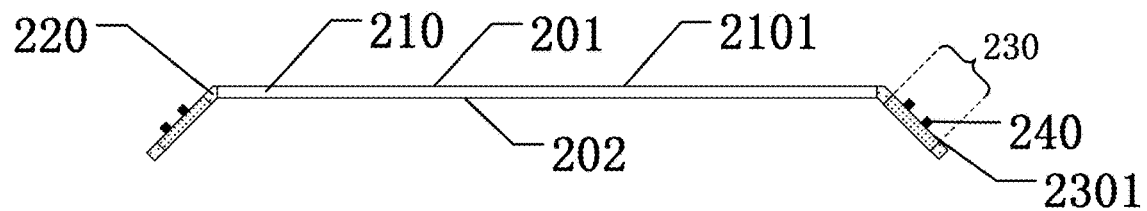
FIG. 2c is a spatial structure diagram of a mask strip in the mask shown in FIG. 2b.

FIG. 2a is a structural schematic diagram of a mask provided by an embodiment of the present disclosure; FIG. 2b is a cross-sectional view of the mask of FIG. 2a along M-N; FIG. 2c is a spatial structure diagram of a mask strip in the mask shown in FIG. 2b; and FIG. 2d is a spatial structure diagram of a support in the mask shown in FIG. 2b.

As shown in FIG. 2a to FIG. 2d, a mask provided by at least one embodiment of the present disclosure comprises: a support 100 and a mask strip 200 mounted on the support 100, the mask strip 200 comprising at least two connecting portions 220 connected with the support 100 and a pattern portion 210 located between the connecting portions 220. For example, the connecting portion 220 comprises a mounting region 230, and the mask strip 200 is mounted on the support 100 through a connector 240 in the mounting region 230. The mask strip 200 comprises an upper surface 201 and a lower surface 202 opposite to each other, the pattern portion 210 comprises a first outer surface 2101 provided on the upper surface 201, and a surface of the mounting region 230 facing away from the support 100 is a second outer surface 2301, wherein, the second outer surface 2301 and the first outer surface 2101 are non-coplanar with each other, so that the second outer surface 2301 in the mask strip 200 will not be in contact with a substrate, and the connector 240 will not be in contact with the substrate, during evaporation. As compared with FIG. 1a, the mask of the above-described structure eliminates a gap between the mask strip 200' and the substrate 300', and implements close fitting between the first outer surface of the mask strip and the surface of the substrate to be coated, which thus increases the defect-free ratio of evaporation of the substrate.

It should be noted that, in at least one embodiment of the present disclosure, a mask strip 200 is not limited to comprising two connecting portions 220, and may also comprise more than two connecting portions 220. The number of connecting portions 220 comprised in the mask strip 200 may be decided according to actual needs, which will not be limited in the embodiments of the present disclosure. In order to facilitate explanation of the technical solution according to the embodiments of the present disclosure, the technical solution in the following embodiments of the present disclosure is illustrated, with a case where the mask strip 200 comprises two connecting portions 220 and a pattern portion 210 is provided between the two connecting portions 220 as an example.

Figure 2D:
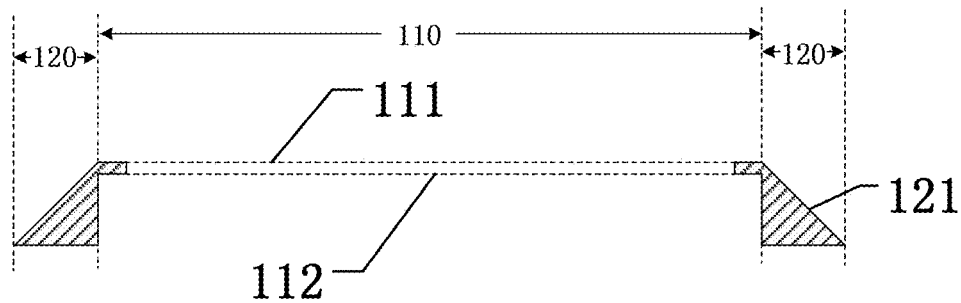
FIG. 2d is a spatial structure diagram of a support in the mask shown in FIG. 2b.

For example, in at least one embodiment of the present disclosure, as shown in FIG. 2a to FIG. 2d, a support 100 comprises a main body (a portion of the support 100 located in a region 110 in FIG. 2d) and two side portions provided on two opposite sides of the main body (portions of the support 100 in regions 120 in FIG. 2d). The main body 110 may be, for example, of a square frame shape, with a rectangular or square opening in the center, and the opening facilitates exposing the mask strip 200 during evaporation. A shape and a size of the opening may be designed according to the number and distribution of the mask strips 200. For example, the opening may be of a regular shape such as a round shape, an elliptical shape and a polygonal shape, or may be of an irregular shape. For example, in at least one embodiment of the present disclosure, a main body and side portions may be of an integrated structure. A pattern portion 210 of a mask strip 200 is supported by the main body 110, and two connecting portions 220 of the mask strip 200 are respectively mounted on two side portions 120 of the support 100. The main body 110 comprises a first main surface 111 and a second main surface 112 opposite to each other, and a side portion 120 comprises a third outer surface 121. For example, the first main surface 111 is connected with the third outer surface 121, and the second outer surface 2301 of the mask strip 200 may be provided with a connector 240 which is configured to fix the mask strip 200 onto the support 100. The mask strip 200 can be fixed onto the support 100 in various modes, for example, a riveting mode with a screw, a pin, and the like, or a welding mode such as electrical arc welding, and the like, which will not be limited in the embodiments of the present disclosure. The pattern portion 210 of the mask strip 200 has a patterned structure; for example, the pattern portion 210 comprises a plurality of shielding regions and a plurality of non-shielding regions; for example, each of shielding region and each of the non-shielding region may be alternately arranged. In a procedure of evaporating with a mask, an evaporation material (a material for evaporation) may pass through the non-shielding region but cannot pass through the shielding region, so after the evaporation material is evaporated and deposited on the substrate, a patterned structure corresponding to the non-shielding region of the mask strip 200 is formed on the substrate.

For example, in at least one embodiment of the present disclosure, as shown in FIG. 2a, a main body of a support 100 may be a frame structure having an opening, side portions are portions extending from sides S1 and S2 of the frame structure, and the side portions may be used for having a mask strip 200 fixed. It may be understood that, on sides S3 and S4 where the mask strip needs not to be fixed, the support 100 may not be provided with the side portions. In at least one embodiment of the present disclosure, structures of a support and a side portion depend on relative positional relationship between a second outer surface and a first outer surface on the mask strip 200, which will be described in detail in the embodiments below.

For example, in at least one embodiment of the present disclosure, a second outer surface of a connecting portion is further away from a substrate with respect to a first outer surface of a pattern portion. For example, the second outer surface is located on a side facing a lower surface of a plane where the first outer surface is located. By providing the second outer surface 2301 and the first outer surface 2101 in the mask strip 200 not coplanar with each other, and providing the second outer surface 2301 distal to a surface of the substrate to be coated, the second outer surface 2301 in the mask strip 200 is prevented from being in contact with the substrate.

Figure 2E:
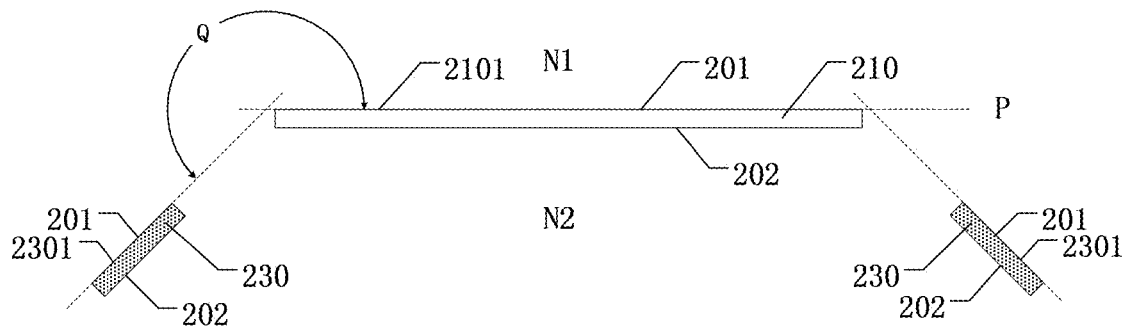
FIG. 2e is a schematic diagram of spatial distribution of a working surface and a mounting surface of a mask strip provided by an embodiment of the present disclosure.

FIG. 2e is a schematic diagram of spatial distribution of a first outer surface and a second outer surface of a mask strip in a mask provided by an embodiment of the present disclosure (in order to facilitate understanding, only a pattern portion 210 and a mounting region 230 in the mask strip 200, rather than a complete mask strip 200, is shown in FIG. 2e). For example, as shown in FIG. 2e, the first outer surface 2101 of the mask strip 200 is, for example, located in a plane P (a plane where the first outer surface 2101 is located), for example, the plane P may be a horizontal plane, and a side N1 of the horizontal plane P may be provided with a substrate to be coated. The second outer surface 2301 is located on a side N2 of the plane P (i.e., a side of the plane P facing a lower surface 202), and the plane P may serve as an interface between the mask strip 200 and the substrate to be coated. Therefore, the second outer surface 2301 and the first outer surface 2101 are non-coplanar with each other; in this case, a connector 240 located on the second outer surface 2301 will not be in contact with the substrate, and a warped corner of the mask strip 200 will not affect the substrate, and thus, the defect-free ratio of evaporation is increased.

Hereinafter, as shown in FIG. 2e, technical solutions in at least one of the following embodiments of the present disclosure will be described, with a case where an included angle Q between a first outer surface 2101 and a second outer surface 2301 in a mask strip 200 is greater than or equal to 180 degrees and less than or equal to 360 degrees as an example.

Figure 2F:
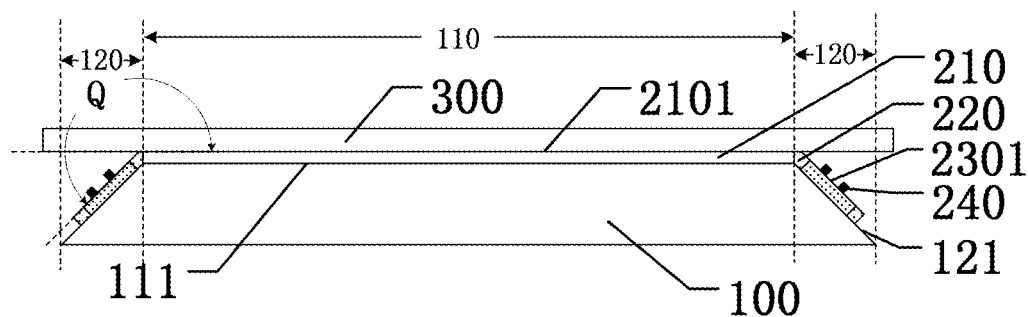
FIG. 2f is a front view of a mask and a substrate provided by an embodiment of the present disclosure.

FIG. 2f is a front view of a mask and a substrate provided by an embodiment of the present disclosure. For example, in at least one embodiment of the present disclosure, as shown in FIG. 2f, a third outer surface 121 of each side portion 120 of a support 100 may be set as an inclined plane, two connecting portions 220 of a mask strip 200 are mounted on the inclined plane (the third outer surface 121) through connectors 240, and an included angle Q between a second outer surface 2301 and a first outer surface 2101 in the mask strip 200 is greater than 180 degrees and less than 270 degrees. In this case, the second outer surface 2301 of the mask strip 200 will not be in contact with a substrate 300 to be coated, and the connector 240 will not be in contact with the substrate 300 to be coated, which implements close fitting between the first outer surface of the mask strip 200 and the substrate 300, and may increase the defect-free ratio of evaporation of the substrate 300.

For example, in at least one embodiment of the present disclosure, inclinations of two connecting portions 220 may be the same as or different from each other, which will not be limited in the embodiments of the present disclosure. For example, each mask strip 200 may comprise a first connecting portion and a second connecting portion, and an included angle between a second outer surface of the first connecting portion and the first outer surface 2101 may be same as or different from an included angle between a second outer surface of the second connecting portion and the first outer surface 2101. Hereinafter, technical solutions the following embodiments of the present disclosure will be described, with a case where the included angle between the second outer surface of the first connecting portion and the first outer surface 2101 and the included angle between the second outer surface of the second connecting portion and the first outer surface 2101 are same as each other an example.

Figure 2G:
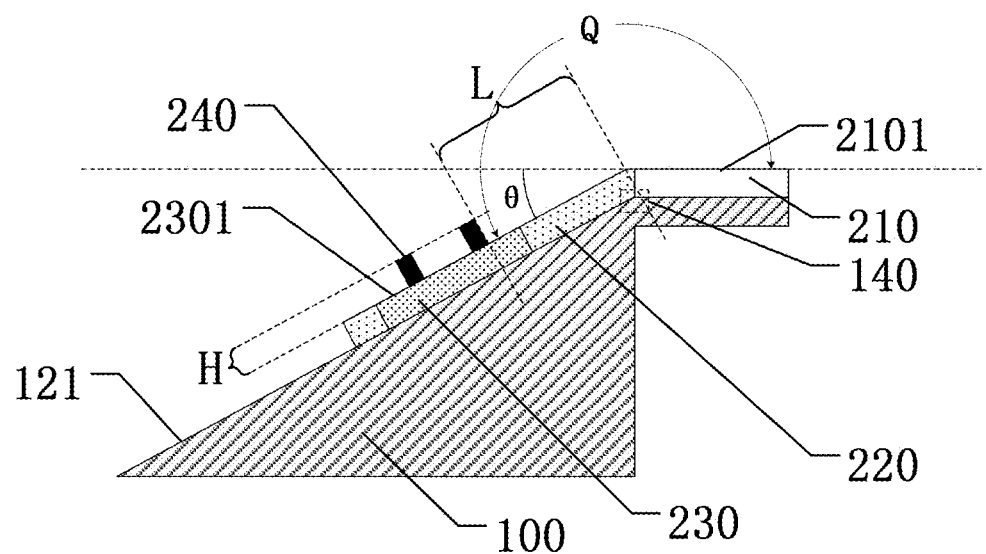
FIG. 2g is a partial structural schematic diagram of a mask provided by an embodiment of the present disclosure.

FIG. 2g is a partial structural schematic diagram of a mask provided by an embodiment of the present disclosure. For example, in at least one embodiment of the present disclosure, a mask strip 200 is fixed onto a support 100 through connectors 240 on second outer surfaces 2301. Because the connector 240 has a certain height, in at least one embodiment of the present disclosure, with respect to a mask as shown in FIG. 2g, an included angle Q between a second outer surface 2301 and a first outer surface 2101 may be further set according to the height of a connector 240. As shown in FIG. 2g, in a direction perpendicular to a plane where the second outer surface 2301 is located, the height of the connector 240 is H, and in a direction parallel to the plane where the second outer surface 2301 is located, a distance from the connector 240 to a vertex of an included angle θ is L (the two connectors 240 may have different values of L), as long as θ>arctan(H/L) is satisfied, and because θ=Q-180 degrees, the included angle Q>arctan (H/L)+180 degrees.

For example, in at least one embodiment of the present disclosure, as shown in FIG. 2g, since the connecting portion 220 is fixed onto the side portion 120 of a support 100 through the connector 240, the mask strip 200 is stretched and tightened by the connector 240, so a portion of the mask strip 200 located at a joint between the connecting portion 220 and a pattern portion 210 may be supported by an edge 140 of the support 100 where a main body 110 and the side portion 120 of the support 100 intersect with each other. That is, the edge 140 of the support 100 may support the portion of the mask strip 200 located at the joint between the connecting portion 220 and the pattern portion 210, so as to ensure flatness of the pattern portion 210 of the mask strip 200. As compared with the structure of the mask shown in FIG. 1b, the mode of fixing the mask strip 200 according to the embodiment of the present disclosure is changed from point fixation to linear fixation (the surface morphology of the pattern portion 210 of the mask strip 200 does not no longer depends on the welding spot 240', but depends on the edge 140), so that a wrinkle 250' in FIG. 1b may be avoided. Even if the wrinkle 250' appears on a second outer surface 2301, the above-described structure (the surface morphology of the pattern portion 210 defined by the edge 140) may also reduce or eliminate extension of the wrinkle toward the pattern portion 210.

In order to prevent a repairing operation from affecting a fixation position (e.g., the edge 140) of the mask strip 200, the second outer surface 2301 may be set distal to the position of the edge 140 of the support 100. For example, in at least one embodiment of the present disclosure, in a case where an included angle Q of a second outer surface 2301 and a first outer surface 2101 is greater than 180 degrees and less than 270 degrees, a third outer surface 121 of a side portion 120 of a support 100 may be set in a stair-step shape. In this way, in the procedure of repairing the mask, a repairing operation, for example, a polishing operation will not affect the edge 140, and accuracy of the mask may be ensured.

Figure 2H:
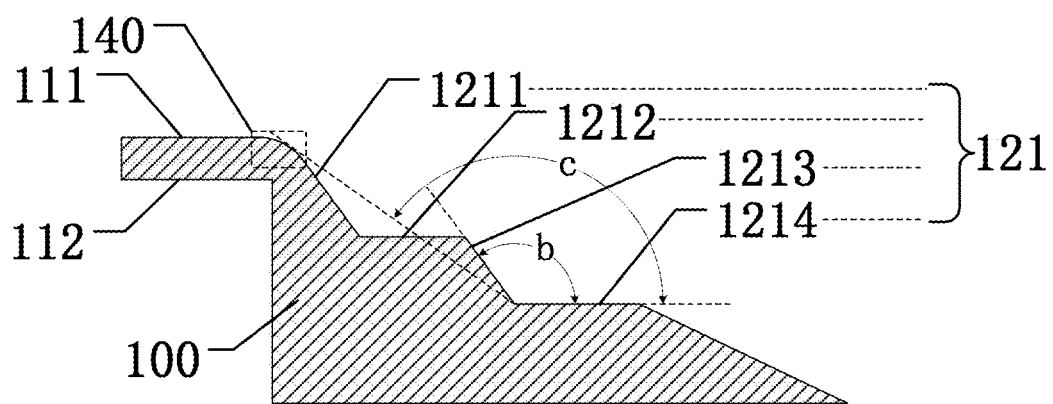
FIG. 2h is a partial structural schematic diagram of another mask provided by an embodiment of the present disclosure.

FIG. 2h is a partial structural schematic diagram of another mask provided by an embodiment of the present disclosure. As shown in FIG. 2h, in a case where an included angle Q between a second outer surface 2301 and a first outer surface 2101 of a mask strip 200 is greater than 180 degrees and less than 270 degrees, a third outer surface 121 of a side portion 120 of a support 100 is set in a two-stair-step shape and comprises a first sub-surface 1211, a second sub-surface 1212, a third sub-surface 1213 and a fourth sub-surface 1214 that are sequentially connected; the first sub-surface 1211 is connected with a first main surface 111 of a main body 110. For example, the second outer surface 2301 may be provided on the second sub-surface 1212, the third sub-surface 1213, or the fourth sub-surface 1214, so that polishing the second outer surface 2301 will not affect an edge 140 of the support 100, while a repairing operation is performed on the mask.

For example, the first sub-surface 1211 and the first main surface 111 of the main body 110 intersect with each other to form a first boundary, and the third sub-surface 1213 and the fourth sub-surface 1214 intersect with each other to form a second boundary; an included angle c between a plane defined by the first boundary and the second boundary and the fourth sub-surface 1214 is greater than an included angle b between the third sub-surface 1213 and the fourth sub-surface 1214. In a case where the included angle c is greater than the included angle b, when the second outer surface 2301 is fixed onto the fourth sub-surface 1214, a connecting portion of the mask strip 200 (a portion at a joint between a pattern portion 210 and a connecting portion 220) is supported by both the edge 140 of the support 100 and an edge where the second sub-surface 1212 and the third sub-surface 1213 intersect with each other, which further achieves fixing and tightening effects on the mask strip 200, and reduces or eliminates wrinkles.

It should be noted that, in at least one embodiment of the present disclosure, the number of stair-steps is not limited when a third outer surface 121 of a side portion 120 of a support 100 is set in a stair-step shape, and the third outer surface 121 of the side portion 120 of the support 100 may also be set in a one-stair-step shape or a multi-stair-step shape, and the like.

For example, in at least one embodiment of the present disclosure, an edge 140 where a first main surface 111 of a main body 110 and a third outer surface 121 intersect with each other may be rounded or chamfered (as shown in a region of a dotted-line square 140 in FIG. 2h). As shown in FIG. 2h, the edge 140 of a support 100 may be set as a cambered surface having a certain camber (e.g., greater than 0 degree and less than 45 degrees). The edge 140 of the support 100 may affect surface morphology of a pattern portion 210 in a mask strip 200, a partial region of the mask strip 200 (e.g., a joint between a pattern portion 210 and a connecting portion 220) will be subjected to a relatively large force if supported by the edge 140, and the edge 140 is set to have a round corner structure so that it has a cambered surface, which may prevent the edge 140 from slashing the mask strip 200 because the edge 140 is too sharp (with partial stress concentrated).

Figure 3:
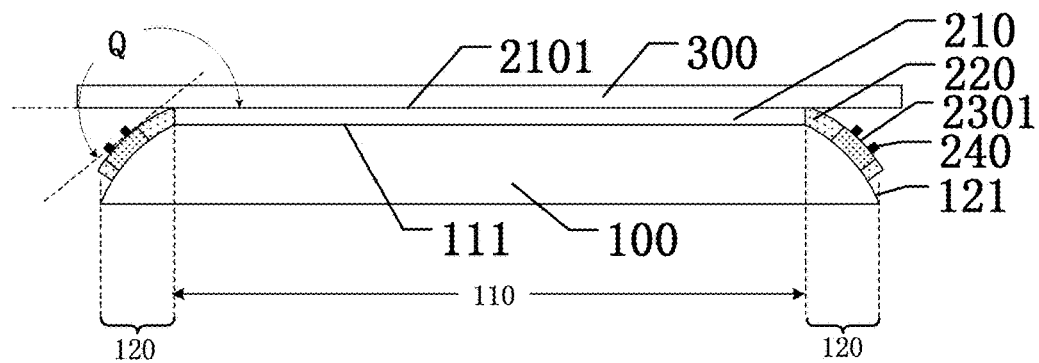
FIG. 3 is a structural schematic diagram of a still another mask provided by an embodiment of the present disclosure.

In at least one embodiment of the present disclosure, a shape of a third outer surface 121 of a side portion 120 of a support 100 is not limited. For example, in a case where an included angle between a second outer surface 2301 and a first outer surface 2101 is greater than 180 degrees and less than 270 degrees, the third outer surface 121 of the side portion 120 of the support 100 and the second outer surface 2301 of the mask strip 200 are conformal, for example, both are cambered surfaces, or of other curved shapes, and the like. FIG. 3 is a structural schematic diagram of a still another mask provided by an embodiment of the present disclosure. As shown in FIG. 3, a third outer surface 121 of a side portion 120 of a support 100 is a cambered surface, so that a second outer surface 2301 provided on the third outer surface 121 is also a cambered surface accordingly, as long as an included angle Q between a tangent line of the second outer surface 2301 having a cambered shape and a first outer surface 2101 is greater than 180 degrees and less than 270 degrees, and thus, the second outer surface 2301 is not coplanar with the first outer surface 2101, and the second outer surface 2301 is not in contact with the substrate 300.

For example, in at least one embodiment of the present disclosure, as shown in FIG. 3, at an end portion of a third outer surface 121 proximal to a first main surface 111, a tangent line of the third outer surface 121 is substantially parallel to the first main surface 111. In this way, the third outer surface 121 and the first main surface 111 are substantially smoothly connected with each other, which not only prevents an edge 140 from slashing a mask strip 200 because the edge 140 is too sharp (with partial stress concentrated), but also allows both portions of the connecting portion 220 located at the pattern portion 210 and the second outer surface 2301 to be supported by the third outer surface 121, so as to further prevent a wrinkle from extending toward the pattern portion 210, even if the wrinkle appears in the second outer surface 2301.

FIG. 4 is a structural schematic diagram of a yet another mask provided by an embodiment of the present disclosure. As shown in FIG. 4, an included angle Q between a second outer surface 2301 and a first outer surface 2101 is 180 degrees, for example, the first outer surface 2101 and the second outer surface 2301 are parallel to each other and provided in different horizontal planes. A specific shape of a support 100 may be set according to positional relationship between the first outer surface 2101 and the second outer surface 2301. For example, in at least one embodiment of the present disclosure, as shown in FIG. 4, a side portion 120 of a support 100 has a groove. For example, a groove D may be provided on a first main surface 111 of the support 100, and a second outer surface 2301 of a mask strip 200 may be provided in the groove D. It should be noted that, in a direction perpendicular to a plane where the second outer surface 2301 is located, a depth of the groove D may be determined according to actual needs, as long as the depth of the groove D may allow a connector 240 on the second outer surface 2301 not to be in contact with a the substrate to be coated. For example, the depth of the groove D is greater than a height of the connector 240. In one example, the depth of the groove D may be greater than about 10 microns, for example, the depth of the groove D ranges from 10 microns to 20 microns. In this way, the second outer surface 2301 of the mask strip 200 will not be in contact with the substrate 300 to be coated, and the first outer surface 2101 of the mask strip 200 and the substrate 300 may be closely fitted to each other, so as to increase the defect-free ratio of evaporation of the substrate 300.

FIG. 5 is a structural schematic diagram of a still another mask provided by an embodiment of the present disclosure. For example, in a mask provided in at least one embodiment of the present disclosure, as shown in FIG. 5, an included angle Q between a second outer surface 2301 and a first outer surface 2101 is 360 degrees, for example, the first outer surface 2101 and the second outer surface 2301 are parallel to each other and provided in different horizontal planes. A specific shape of a support 100 may be set according to positional relationship between the first outer surface 2101 and the second outer surface 2301. For example, in at least one embodiment of the present disclosure, a side portion 120 of a support 100 may be in strip-shape. For example, a second outer surface 2301 of a mask strip 200 may be provided on a lower surface of the side portion 120 of the support 100 (a surface on a side of the side portion 120 distal to a pattern portion 210). In this case, the second outer surface 2301 of the mask strip 200 will not be in contact with a substrate 300 to be coated, and the connector 240 on the second outer surface 2301 will not be in contact with the substrate, which may increase the defect-free ratio of evaporation of the substrate 300.

Figure 6:
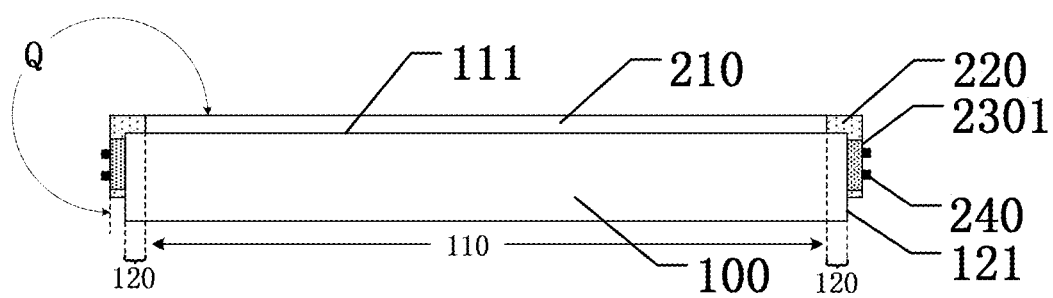
FIG. 6 is a structural schematic diagram of a yet another mask provided by an embodiment of the present disclosure.

FIG. 6 is a structural schematic diagram of a yet another mask provided by an embodiment of the present disclosure. For example, in a mask provided in at least one embodiment of the present disclosure, as shown in FIG. 6, an included angle Q between a second outer surface 2301 and a first outer surface 2101 of a mask strip 200 is 270 degrees. For example, a third outer surface 121 of a side portion 120 of a support 100 may be a vertical plane, i.e., a plane where the third outer surface 121 is located is perpendicular to a first main surface 111 of the support 100. In this case, the second outer surface 2301 of the mask strip 200 will not be in contact with a substrate 300 to be coated, and the connector 240 on the second outer surface 2301 will not be in contact with the substrate 300, which may increase the defect-free ratio of evaporation of the substrate 300.

Figure 7:
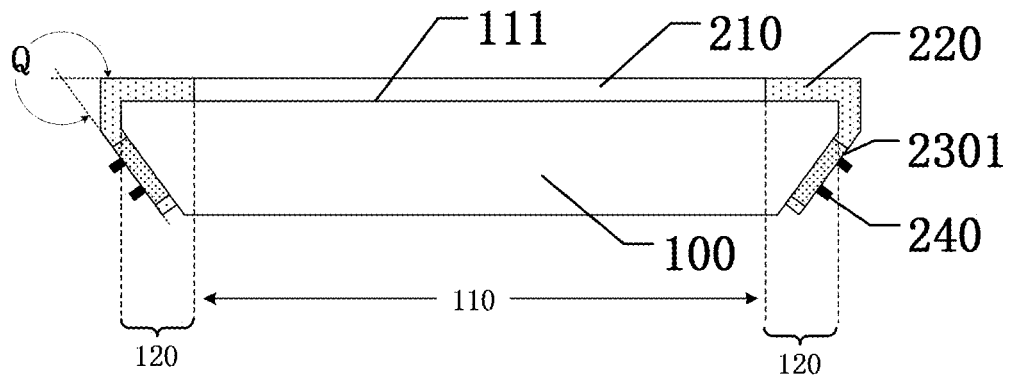
FIG. 7 is a structural schematic diagram of a still another mask provided by an embodiment of the present disclosure.

FIG. 7 is a structural schematic diagram of a still another mask provided by an embodiment of the present disclosure. For example, in a mask provided in at least one embodiment of the present disclosure, as shown in FIG. 7, an included angle Q between a second outer surface 2301 and a first outer surface 2101 of a mask strip 200 is greater than 270 degrees and less than 360 degrees. For example, a third outer surface 121 of a side portion 120 of a support 100 may be a plane which is inclined inward (e.g., inclined from an edge of a main body 110 toward the interior of the main body 110), an included angle between the inclined plane and a first main surface 111 of the support 100 may be between 270 degrees and 360 degrees, and the second outer surface 2301 of the mask strip 200 may be provided on the inclined plane. In this case, the second outer surface 2301 of the mask strip 200 will not be in contact with the substrate 300 to be coated, and a connector 240 on the second outer surface 2301 will not be in contact with the substrate 300, which may increase the defect-free ratio of evaporation of the substrate 300.

It should be noted that, in the foregoing embodiments, in a case where the included angle between the second outer surface 2301 and the first outer surface 2101 of the mask strip 200 is 180 degrees, or greater than 270 degrees and less than or equal to 360 degrees, the surface of the support 100 for having the second outer surface 2301 fixed may not be limited to a flat plane, but may also be of a cambered shape, and the like, and contents of the embodiment shown in FIG. 2h may be referred to for a specific structure thereof, which will not be repeated here in the present disclosure.

It should be noted that, in the mask provided in at least one embodiment of the present disclosure, the included angle between the first outer surface 2101 and the second outer surface 2301 of the mask strip 200 will not be limited, and the included angle between the two will not be limited to that between 180 degrees and 360 degrees, as long as the second outer surface 2301 and the first outer surface 2101 are non-coplanar with each other, and the second outer surface 2301 is located on a side of the first outer surface 2101 distal to the surface of the substrate 300 to be coated, so that in the evaporation procedure, the second outer surface will not be in contact with the substrate to be coated, and the defect-free ratio of evaporation of the substrate may be increased.

Figure 8:
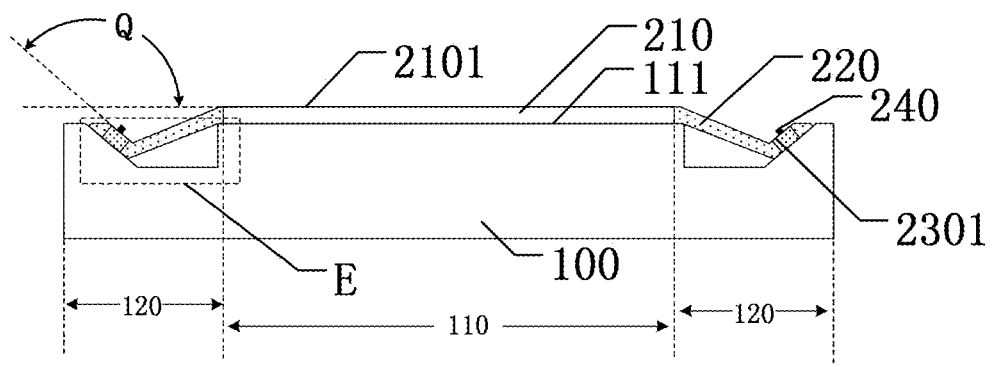
FIG. 8 is a structural schematic diagram of a yet another mask provided by an embodiment of the present disclosure.

FIG. 8 is a structural schematic diagram of a yet another mask provided by an embodiment of the present disclosure. For example, in a mask provided in at least one embodiment of the present disclosure, as shown in FIG. 8, a groove E is provided on a first main surface 111 of a support 100, an inclined surface is provided in the groove E, the second outer surface 2301 of the mask strip 200 is provided on the inclined surface; and in a structure of the mask as shown in FIG. 8, an included angle Q between the second outer surface 2301 and a first outer surface 2101 may be between 0 degree and 180 degrees.

In at least one embodiment of the present disclosure, materials for preparing a support 100 and a mask strip 200 in a mask will not be limited. For example, in at least one embodiment of the present disclosure, materials for preparing a support 100 and a mask strip 200 may comprise a metal material, so that the mask strip 200 may be fixed onto the support 100, for example, by welding, which is convenient to operate with low process difficulty.

At least one embodiment of the present disclosure provides a preparation method of a mask, the preparation method comprising: providing a support and mounting a mask strip on the support; wherein the mask strip comprises at least two connecting portions connected with the support, and a pattern portion located between the at least two connecting portions, the mask strip comprises an upper surface and a lower surface opposite to each other, the pattern portion comprises a first outer surface provided on the upper surface, and the connecting portion comprises a second outer surface provided on the upper surface; the second outer surface and the first outer surface are non-coplanar with each other, and the second outer surface is located on a side of the first outer surface proximal to the lower surface. The foregoing embodiments may be referred to for a specific structure of the mask, which will not be repeated here.

With the mask prepared by using the preparation method according to at least one embodiment of the present disclosure, when the substrate is being coated with the mask, the second outer surface of the mask strip will not be in contact with the substrate, so that a warped corner of the mask strip and a connector (for fixing the mask strip) on the second outer surface, etc., will not affect fitting closeness between the mask strip and the substrate, which may increase the defect-free ratio of evaporation.

At least one embodiment of the present disclosure provides an operation method of a mask, the method comprising: placing a the substrate to be coated on a mask, wherein a surface of the substrate to be coated is in contact with a first outer surface of the mask, and the surface of the substrate to be coated is not in contact with a second outer surface of the mask. For a specific structure of the mask, related description in the foregoing embodiments (the embodiments with respect to the mask) may be referred to, and the specific structure of the mask will not be limited in the present disclosure.

The mask in the above-described embodiment may allow the mask strip and the substrate to be coated to be fitted closely to each other, and in this way, it may be considered that the surface of the substrate to be coated is coplanar with the first outer surface of the pattern portion of the mask strip; because the second outer surface and the first outer surface of the mask strip in the mask are non-coplanar with each other, and the second outer surface is located on a side of the first outer surface proximal to a lower surface of the mask strip, the second outer surface of the mask strip will not be in contact with the surface of the substrate to be coated, which may increase the defect-free ratio of evaporation.

For example, in at least one embodiment of the present disclosure, a surface of a substrate to be coated and a second outer surface are non-coplanar with each other, and an included angle between the two is greater than or equal to 180 degrees and less than or equal to 360 degrees. For example, the included angle between the surface of the substrate to be coated and the second outer surface of the mask comprises: 180 degrees, greater than 180 degrees and less than 270 degrees, 270 degrees, greater than 270 degrees and less than 360 degrees, or 360 degrees, and the like. For specific structures of the mask in different angular ranges as described above, contents in the foregoing embodiments may be referred to, which will not be repeated here.

The embodiments of the present disclosure provide the mask, the preparation method and the operation method thereof, and may have at least one of advantageous effects below:

(1) At least one embodiment of the present disclosure provides a mask, and in the mask, the second outer surface of the mask strip is not coplanar with the first outer surface, and is located on the same side of the plane where the first outer surface is located, so that the second outer surface is not in contact with the substrate to be coated, which may increase the defect-free ratio of evaporation of the substrate.

(2) In the mask provided by at least one embodiment of the present disclosure, as compared with the current structure, the mode of fixing the mask strip in the mask according to the embodiment of the present disclosure is changed from point fixation to linear fixation, which may reduce or eliminate the wrinkle problem in the mask strip, and may further increase evaporation accuracy of the substrate.

(3) In the mask provided by at least one embodiment of the present disclosure, the edge of the support for supporting the surface morphology of the evaporation region of the mask strip may be designed to be rounded or chamfered, which may prevent the mask strip from being slashed; the third outer surface of the side portion of the support is designed as a stair-step shape, which, in the procedure of repairing the mask, may prevent the edge of the support from being abraded by the polishing operation, so as to ensure precision of the mask.

With respect to the present disclosure, several points below need to be explained:

(1) The drawings of the embodiments of the present disclosure relate only to the structures involved in the embodiments of the present disclosure, and normal designs may be referred to for other structures.

(2) For the sake of clarity, in the drawings used for describing the embodiments of the present disclosure, thicknesses of layers or regions are enlarged or reduced, that is, these drawings are not drawn in an actual scale.

(3) In case of no conflict, the embodiments of the present disclosure and the features in the embodiments may be combined with each other to obtain a new embodiment.

What is described above is related to the illustrative embodiments of the disclosure only and not limitative to the scope of the disclosure; the scopes of the disclosure are defined by the accompanying claims.

The invention claimed is:

1. A mask, comprising:
a support and a mask strip mounted on the support, the mask strip comprising at least two connecting portions each connected with the support, and a pattern portion located between the at least two connecting portions, the pattern portion comprising a first outer surface, and each of the at least two connecting portions comprising a second outer surface;
wherein the support is provided on a side of the mask strip distal to the first outer surface, the support comprises a main body and two side portions provided on opposite sides of the main body, the main body is a square frame, the pattern portion of the mask is supported by the main body, the at least two connecting portions of the mask strip are respectively mounted on the two side portions, the main body comprises a first main surface and a second main surface opposite to each other, each of the two side portions comprises a third outer surface, and the first main surface is connected with the third outer surface, wherein an included angle between the second outer surface and the first outer surface is greater than 180 degrees and less than 270 degrees, the third outer surface of each of the two side portions is in two-stair-step shape and comprises a first sub-surface, a second sub-surface, a third sub-surface and a fourth sub-surface which are sequentially connected, the first sub-surface is connected with the first main surface of the main body, the first sub-surface and the first main surface of the main body intersect with each other to form a first boundary, and the third sub-surface and the fourth sub-surface intersect with each other to form a second boundary; an included angle between a plane defined by the first boundary and the second boundary and the fourth sub-surface is greater than an included angle between the third sub-surface and the fourth sub-surface, and the second outer surface is fixed onto the fourth sub-surface, wherein each of the at least two connecting portions of the mask strip is supported by both an edge where the first main surface of the main body and the third outer surface of each of the two side portions intersect with each other and an edge where the second sub-surface and the third sub-surface intersect with each other.

2. The mask according to claim 1, wherein a substrate to be coated is provided on the first outer surface of the pattern portion, and the second outer surface of each of the at least two connecting portions is further away from the substrate to be coated with respect to the first outer surface of the pattern portion.

3. The mask according to claim 1, wherein the at least two connecting portions comprise a first connecting portion and a second connecting portion, and an included angle between a second outer surface of the first connecting portion and the first outer surface of the pattern portion is equal to an included angle between a second outer surface of the second connecting portion and the first outer surface of the pattern portion.

4. The mask according to claim 1, wherein a portion of the mask strip at a joint between each of the at least two connecting portions and the pattern portion is supported by an edge of the support where the first main surface of the main body and the third outer surface of each of the two side portions intersect with each other.

5. The mask according to claim 4, wherein the edge of the support where the first main surface of the main body and the third outer surface of each of the two side portions intersect with each other is rounded or chamfered.

6. A method of preparation a mask, comprising:
providing a support and mounting a mask strip on the support;
wherein the mask strip comprises at least two connecting portions each connected with the support, and a pattern portion located between the at least two connecting portions, the pattern portion comprises a first outer surface, and each of the at least two connecting portions comprises a second outer surface; and the second outer surface and the first outer surface are non-coplanar with each other,
wherein the support is provided on a side of the mask strip distal to the first outer surface, the support comprises a main body and two side portions provided on opposite sides of the main body, the main body is a square frame, the pattern portion of the mask is supported by the main body, the at least two connecting portions of the mask strip are respectively mounted on the two side portions, the main body comprises a first main surface and a second main surface opposite to each other, each of the two side portions comprises a third outer surface, and the first main surface is connected with the third outer surface,
wherein an included angle between the second outer surface and the first outer surface is greater than 180 degrees and less than 270 degrees, the third outer surface of each of the two side portions is in two-stair-step shape and comprises a first sub-surface, a second sub-surface, a third sub-surface and a fourth sub-surface which are sequentially connected, the first sub-surface is connected with the first main surface of the main body, the first sub-surface and the first main surface of the main body intersect with each other to form a first boundary, and the third sub-surface and the fourth sub-surface intersect with each other to form a second boundary; an included angle between a plane defined by the first boundary and the second boundary and the fourth sub-surface is greater than an included angle between the third sub-surface and the fourth sub-surface, and the second outer surface is fixed onto the fourth sub-surface,
wherein each of the at least two connecting portions of the mask strip is supported by both an edge where the first main surface of the main body and the third outer surface each of the two side portions intersect with each other and an edge where the second sub-surface and the third sub-surface intersect with each other.

7. An operation method of the mask according to claim 1, comprising:
placing a substrate on the mask, wherein a surface of the substrate to be coated is in contact with the first outer surface of the mask, and the surface of the substrate to be coated is in non-contact with the second outer surface of the mask.

* * * * *